US007524920B2

(12) United States Patent
Pecorini et al.

(10) Patent No.: US 7,524,920 B2
(45) Date of Patent: *Apr. 28, 2009

(54) BIAXIALLY ORIENTED COPOLYESTER FILM AND LAMINATES THEREOF

(75) Inventors: Thomas Joseph Pecorini, Kingsport, TN (US); Douglas Stephens McWilliams, Kingsport, TN (US); Spencer Allen Gilliam, Kingsport, TN (US); Mark Elliott Tincher, Kingsport, TN (US); Candace Michele Tanner, Kingsport, TN (US)

(73) Assignee: Eastman Chemical Company, Kingsport, TN (US)

( * ) Notice: Subject to any disclaimer, the term of this patent is extended or adjusted under 35 U.S.C. 154(b) by 140 days.

This patent is subject to a terminal disclaimer.

(21) Appl. No.: 11/170,508

(22) Filed: Jun. 29, 2005

(65) Prior Publication Data

US 2006/0134409 A1 Jun. 22, 2006

Related U.S. Application Data

(60) Provisional application No. 60/636,713, filed on Dec. 16, 2004.

(51) Int. Cl.
*C08G 63/00* (2006.01)
(52) U.S. Cl. ............... 528/272; 428/1.6; 428/411.1; 428/412; 428/480; 428/702; 528/271
(58) Field of Classification Search ............ 428/355 R, 428/411.1, 412, 1.6, 480, 702; 528/271, 528/272, 411.1
See application file for complete search history.

(56) References Cited

U.S. PATENT DOCUMENTS

| | | | |
|---|---|---|---|
| 2,901,466 A | 8/1959 | Kibler et al. | |
| 3,284,223 A | 11/1966 | Watson et al. | |
| T876,001 I4 | 7/1970 | Bell et al. | |
| 3,896,076 A | 7/1975 | Watanabe et al. | |
| 3,907,754 A | 9/1975 | Tershansy et al. | |
| 3,962,145 A | 6/1976 | Matsuo et al. | |
| 3,962,189 A | 6/1976 | Russin et al. | |
| 4,010,145 A | 3/1977 | Russin et al. | |
| 4,356,299 A | 10/1982 | Cholod et al. | |
| 4,362,775 A * | 12/1982 | Yabe et al. ............ | 428/213 |
| 4,557,982 A | 12/1985 | Nouda et al. | |
| 5,017,680 A | 5/1991 | Sublett | |
| 5,153,302 A * | 10/1992 | Masuda et al. ............ | 528/272 |
| 5,668,243 A | 9/1997 | Yau et al. | |
| 5,681,918 A | 10/1997 | Adams et al. | |
| 5,824,394 A * | 10/1998 | Kinoshita et al. ........ | 428/195.1 |
| 6,583,935 B1 | 6/2003 | Saif et al. | |
| 6,629,833 B1 | 10/2003 | Ohya et al. | |
| 6,743,488 B2 | 6/2004 | Memarian et al. | |
| 7,147,927 B2 | 12/2006 | Pecorini et al. | |
| 2002/0018883 A1 | 2/2002 | Okazaki et al. | |
| 2002/0058133 A1 | 5/2002 | Mueller et al. | |
| 2004/0013892 A1 | 1/2004 | Yano et al. | |
| 2004/0046497 A1 | 3/2004 | Schaepkens et al. | |
| 2004/0178729 A1 | 9/2004 | Kim et al. | |
| 2004/0265608 A1 | 12/2004 | Pecorini et al. | |
| 2005/0098738 A1 | 5/2005 | Laney et al. | |
| 2005/0100838 A1 | 5/2005 | Dickerson et al. | |
| 2005/0100840 A1 | 5/2005 | Dickerson et al. | |
| 2006/0275558 A1 * | 12/2006 | Pecorini et al. ............ | 428/1.6 |

FOREIGN PATENT DOCUMENTS

| | | |
|---|---|---|
| EP | 0 483 757 A2 | 5/1992 |
| EP | 0 962 483 A1 | 12/1999 |
| EP | 1207035 A1 | 5/2002 |
| GB | 1117904 A | 6/1968 |
| JP | 58 214208 A | 12/1983 |
| JP | 60 069133 A | 4/1985 |
| JP | 91 000215 B2 | 4/1985 |
| JP | 60 085437 A | 5/1985 |
| JP | 90 063256 B2 | 5/1985 |
| JP | 01 299019 A | 12/1989 |
| JP | 2-164632 | 6/1990 |
| JP | 2-187331 | 7/1990 |

(Continued)

OTHER PUBLICATIONS

"Poly(1,4-Cyclohoxylenedimethylene 2,6-Naphthalenedicarboxylate) Polymers and Copolymers Containing Aromatic Acids", Research Disclosure, Oct. 1988, pp. 798-805.
MacDonald, et al., "New Developments in Polyester Film for Flexible Electronics," Mat. Res. Soc. Symp. Proc., 2003, pp. 283-290, vol. 769, Materials Research Society.
Hoffman, Douglas, et al., "Copolyesters of Poly(1,4-Cyclohexanedimethylene Terephthalate) with Isophthalic Acid and 2,6-Naphthalene Dicarboxylic Acid," Polymer Preprints, 1999, 40(i) 572.

(Continued)

*Primary Examiner*—Terressa M Boykin
(74) *Attorney, Agent, or Firm*—Betty J. BOshears; Bernard J. Graves, Jr.

(57) ABSTRACT

Disclosed is a biaxially-oriented polyester film produced from a polyester comprising: (1) diacid residues comprising between about 95 and about 100 mole percent of terephthalic acid residues; (2) diol residues comprising between about 95 and about 100 mole percent of 1,4-cyclohexanedimethanol residues; and (3) about 0.5 to about 5 mole percent of another dicarboxylic acid or diol residue, wherein the polyester comprises a total of 100 mole percent diacid residues and a total of 100 mole percent diol residues. In one embodiment, the biaxially-oriented film has a thickness of 70 to 150 microns (3-5 mils). In another embodiment, the biaxially-oriented film undergoes not more than 3% shrinkage when immersed for 10 seconds in a solder bath preheated to 260° C. The film can be made by stretching an essentially amorphous cast film of thickness between about 450-1800 micron (18-70 mil) at a ratio from about 2.5×2.5 to 3.5×3.5 while being held at a temperature between 90° C. and 130° C., and heat-setting the stretched film at an actual film temperature of from 260° C. to Tm, where Tm is the melting point of the polyester as measured by differential scanning calorimetry (DSC), while maintaining the dimensions of the stretched film.

49 Claims, 3 Drawing Sheets

FOREIGN PATENT DOCUMENTS

| | | | |
|---|---|---|---|
| JP | 2-191638 A2 | | 7/1990 |
| JP | 2 196833 A | | 8/1990 |
| JP | 02-284929 | * | 11/1990 |
| JP | 2 301419 | | 12/1990 |
| JP | 3 241518 A | | 10/1991 |
| JP | 04 214757 A | | 8/1992 |
| JP | 4221623 | * | 8/1992 |
| JP | 05/170961 A | | 7/1993 |
| JP | 05/274719 A | | 10/1993 |
| JP | 06 301148 A2 | | 10/1994 |
| JP | 08 295014 A2 | | 10/1994 |
| JP | 2 679174 B | | 11/1997 |
| JP | 2000/129008 A | | 5/2000 |
| WO | WO 92/14771 A1 | | 9/1992 |
| WO | WO 96/06125 A1 | | 2/1996 |
| WO | WO 01/04938 A1 | | 1/2001 |
| WO | WO 02/065204 A1 | | 8/2002 |
| WO | WO 03/022575 A1 | | 3/2003 |
| WO | WO 2004/003055 A1 | | 1/2004 |

OTHER PUBLICATIONS

"Oriented Polyester Film," Research Disclosure, May 1990, p. 368, vol. 313, No. 10, Havant GB.

Copending U.S. Appl. No. 11/431,238, filed May 10, 2006, Pecorini et al.

Copending U.S. Appl. No. 10/606,070 filed Jun. 25, 2003, Pecorini et al.

Copending U.S. Appl. No. 11/803,025, filed May 11, 2007, Thomas Joseph Pecorini et al.

USPTO Office Action dated Oct. 30, 2008 for copending U.S. Appl. No. 11/431,238.

USPTO Office Action dated Feb. 7, 2008 for copending U.S. Appl. No. 11/803,025.

* cited by examiner

BIAXIALLY ORIENTED COPOLYESTER FILM AND LAMINATES THEREOF

CROSS-REFERENCE TO RELATED APPLICATION

This application claims the benefit of the filing date of U.S. Provisional Patent Application No. 60/636,713, filed on Dec. 16, 2004.

FIELD OF THE INVENTION

This invention pertains to novel, thermally-stable polyester films and to polyester laminates as well as copper-polyester laminates utilizing the thermally-stable polyester films.

BACKGROUND OF THE INVENTION

Poly(ethylene terephthalate) (PET) films are widely used for a variety of wrapping, packaging, and lamination applications. Sometimes, PET film is used in shrink wrap applications in which the film is applied to an object and heated so that the film shrinks around the object. In other applications, such as flexible electronic circuit boards, heat resistant packaging, and cook-in bags, biaxially-oriented and heat-set PET film having good dimensional stability and shrink resistance at elevated temperatures is used. However, biaxially-oriented PET films are not useful at temperatures exceeding 250° C. because their inherent melting temperature (Tm) is 250° C.

Certain applications, such as certain flexible circuit boards, require films that are heat stable (i.e., possessing good dimensional stability) at 260° C. Specifically, the films must not blister or wrinkle when immersed in a solder bath preheated to 260° C. More specifically, these films must undergo 3% or less shrinkage when immersed for 10 seconds in a solder bath preheated to 260° C. Films that meet this requirement are combined with adhesive and circuitry into a flexible laminate that can then be subjected to a wave or dip solder at 260° C. Any blistering or wrinkling of the base film of this laminate during soldering at 260° C. may affect circuit performance in the final application.

Flexible circuit boards commonly use base and cover films in thicknesses of 70-150 microns (3-5 mils). In order to obtain the desired final film properties, these films are obtained by stretching an essentially amorphous cast film at ratios from about 2.5×2.5 to 3.5×3.5 (or more specifically, about 2.5×2.5 to 3×3). This would require the essentially amorphous films to be cast to between about 450-1800 microns (18-70 mils), or more specifically between 450-1400 microns (18-55 mils). The film must first be extruded essentially amorphous prior to stretching in order to prevent breakage during the stretch process. Unfortunately, pure poly(cyclohexylene dimethylene terephthalate) (PCT) crystallizes much more quickly than PET. As such, it is difficult to obtain an essentially amorphous cast or polished film at thicknesses of greater than 400 microns (16 mils). It should be noted that it is not necessary for the edges of the film to be fully amorphous, but only the center of the cast film.

Superior hydrolytic stability is another desirable property for films used in flexible circuit boards, particularly for automotive applications, and cook-in bags. Base films with superior hydrolytic stability produce circuit boards and bags that will maintain their structural integrity. In addition, it is desirable for the substrate and cover films used in flexible circuit boards to be insulative materials, to prevent charge from bridging across the circuitry. The insulative capability of a film used in these applications is measured by the dielectric constant. It is desirable for a film used in flexible circuit board applications to have as low a dielectric constant as possible.

Thus, it is an object of the present invention to provide a composition that can be cast into an essentially amorphous film at thicknesses about 450 microns (18 mils) or greater. It is also an object of the invention to provide a film that is stable at 260° C., that has superior hydrolytic stability, and that has a low dielectric constant. These and other objects will be apparent from the following description and claims of the invention.

SUMMARY OF THE INVENTION

The invention has several aspects. In a first aspect, the invention relates to a biaxially-oriented polyester film. In one embodiment, the polyester film is produced from a polyester comprising:
  (a) diacid residues comprising between about 95 and about 100 mole percent of terephthalic acid residues;
  (b) diol residues comprising between about 95 and about 100 mole percent of 1,4-cyclohexanedimethanol residues; and
  (c) about 0.5 to about 5 mole percent of another dicarboxylic acid or diol residue,
  wherein the polyester comprises a total of 100 mole percent diacid residues and a total of 100 mole percent diol residues, and
  wherein the polyester film has a thickness of 70 to 150 microns.

In another embodiment, the polyester film is produced from a polyester comprising:
  (a) diacid residues comprising between about 95 and about 100 mole percent of terephthalic acid residues;
  (b) diol residues comprising between about 95 and about 100 mole percent of 1,4-cyclohexanedimethanol residues; and
  (c) about 0.5 to about 5 mole percent of another dicarboxylic acid or diol residue,
  wherein the polyester comprises a total of 100 mole percent diacid residues and a total of 100 mole percent diol residues,
  wherein the polyester film has a thickness of 70 to 150 microns,
  wherein the polyester film is produced by stretching an essentially amorphous cast film of thickness between about 450 and 1800 microns at a ratio from about 2.5×2.5 to 3.5×3.5 while being held at a temperature between 90° C. and 130° C., and heat-setting the stretched film at an actual film temperature of from 260° C. to Tm, where Tm is the melting point of the polyester as measured by differential scanning calorimetry (DSC), while maintaining the dimensions of the stretched film, and
  wherein the polyester film undergoes not more than 3% shrinkage when immersed for 10 seconds in a solder bath preheated to 260° C.

In a third embodiment, the polyester film is produced from a polyester comprising:
  (a) diacid residues comprising between about 95 and about 100 mole percent of terephthalic acid residues;
  (b) diol residues comprising between about 95 and about 100 mole percent of 1,4-cyclohexanedimethanol residues; and
  (c) about 0.5 to about 5 mole percent of another dicarboxylic acid or diol residue,
  wherein the polyester comprises a total of 100 mole percent diacid residues and a total of 100 mole percent diol residues, and wherein the polyester film undergoes not more than 3% shrinkage when immersed for 10 seconds in a solder bath preheated to 260° C.

In a fourth embodiment, the polyester film is produced from a polyester comprising:
(a) diacid residues comprising between about 95 and about 100 mole percent of terephthalic acid residues;
(b) diol residues comprising between about 95 and about 100 mole percent of 1,4-cyclohexanedimethanol residues; and
(c) about 0.5 to about 5 mole percent of another dicarboxylic acid or diol residue,
wherein the polyester comprises a total of 100 mole percent diacid residues and a total of 100 mole percent diol residues,
wherein the polyester film is produced by stretching an essentially amorphous cast film of thickness between about 450 and 1800 microns at a ratio from about 2.5× 2.5 to 3.5×3.5 while being held at a temperature between 90° C. and 130° C., and heat-setting the stretched film at an actual film temperature of from 260° C. to Tm, where Tm is the melting point of the polyester as measured by differential scanning calorimetry (DSC), while maintaining the dimensions of the stretched film, and
wherein the polyester film undergoes not more than 3% shrinkage when immersed for 10 seconds in a solder bath preheated to 260° C.

In a second aspect, the invention relates to a thermoplastic article comprising one or more laminates. In one embodiment, at least one of the laminates comprises in order:
I. a thermally curable adhesive; and
II. a biaxially-oriented polyester film produced from a polyester comprising:
(a) diacid residues comprising between about 95 and about 100 mole percent of terephthalic acid residues;
(b) diol residues comprising between about 95 and about 100 mole percent of 1,4-cyclohexanedimethanol residues; and
(c) about 0.5 to about 5 mole percent of another dicarboxylic acid or diol residue,
wherein the polyester comprises a total of 100 mole percent diacid residues and a total of 100 mole percent diol residues, and
wherein the polyester film has a thickness of 70 to 150 microns.

In a second embodiment of the second aspect, at least one of the laminates comprises in order:
I. a copper layer;
II. a thermally curable adhesive; and
III. the biaxially-oriented polyester film of the first embodiment.

In a third embodiment of the second aspect, at least one of the laminates comprises in order:
I. a thermally curable adhesive; and
II. a biaxially-oriented polyester film produced from a polyester comprising:
(a) diacid residues comprising between about 95 and about 100 mole percent of terephthalic acid residues;
(b) diol residues comprising between about 95 and about 100 mole percent of 1,4-cyclohexanedimethanol residues; and
(c) about 0.5 to about 5 mole percent of another dicarboxylic acid or diol residue,
wherein the polyester comprises a total of 100 mole percent diacid residues and a total of 100 mole percent diol residues, and
wherein the polyester film undergoes not more than 3% shrinkage when immersed for 10 seconds in a solder bath preheated to 260° C.

In a fourth embodiment of the second aspect, at least one of the laminates comprises in order:
I. a copper layer;
II. a thermally curable adhesive; and
III. the biaxially-oriented polyester film of the third embodiment.

In a third aspect, the invention relates to a process for the preparation of a thermoplastic article comprising one or more laminates. At least one of the laminates comprises in order:
I. a copper layer;
II. a thermally curable adhesive; and
III. a biaxially-oriented polyester film produced from a polyester comprising:
(a) diacid residues comprising between about 95 and about 100 mole percent of terephthalic acid residues;
(b) diol residues comprising between about 95 and about 100 mole percent of 1,4-cyclohexanedimethanol residues; and
(c) about 0.5 to about 5 mole percent of another dicarboxylic acid or diol residue,
wherein the polyester comprises a total of 100 mole percent diacid residues and a total of 100 mole percent diol residues, and
wherein the polyester film has a thickness of 70 to 150 microns. The process comprises the step of heating the laminate at a temperature of about 120 to 180° C. under pressure for a period of time sufficient to cure the thermally curable adhesive.

In a fourth aspect, the invention relates to a flexible electronic circuit board. In one embodiment, the flexible electronic circuit board comprises at least one biaxially-oriented polyester film produced from a polyester comprising:
(a) diacid residues comprising between about 95 and about 100 mole percent of terephthalic acid residues;
(b) diol residues comprising between about 95 and about 100 mole percent of 1,4-cyclohexanedimethanol residues; and
(c) about 0.5 to about 5 mole percent of another dicarboxylic acid or diol residue,
wherein the polyester comprises a total of 100 mole percent diacid residues and a total of 100 mole percent diol residues, and
wherein the polyester film has a thickness of 70 to 150 microns.

In another embodiment, the flexible circuit board comprises one of the thermoplastic articles mentioned above.

DETAILED DESCRIPTION OF THE INVENTION

The biaxially-oriented polyester films for all embodiments of the invention comprise:
(a) diacid residues comprising between about 95 to about 100 mole percent of terephthalic acid residues;

(b) diol residues comprising between about 95 to about 100 mole percent of 1,4-cyclohexanedimethanol (CHDM) residues; and (c) about 0.5 to about 5 mole percent of another dicarboxylic acid or diol residue, wherein the polyester comprises a total of 100 mole percent of diacid residues and a total of 100 mole percent of diol residues. By "another dicarboxylic acid or diol residue", it is meant a dicarboxylic acid or diol residue other than terephthalic acid residues or CHDM residues.

Preferably, the biaxially-oriented polyester films comprise:

(a) diacid residues comprising between about 97 to about 100 mole percent of terephthalic acid residues;

(b) diol residues comprising between about 97 to about 100 mole percent of 1,4-cyclohexanedimethanol (CHDM) residues; and (c) about 0.7 to about 3 mole percent of another dicarboxylic acid or diol residue, wherein the polyester comprises a total of 100 mole percent of diacid residues and a total of 100 mole percent of diol residues.

The polyester films may be generated from pellets of a single composition or blends of pellets of several compositions as long as the final film composition fits the composition described above. For example, blends can be made from pure PCT and PCT containing 5% comonomer in various ratios, as long as the final blended composition meets the criteria stated above.

The CHDM residues may have any combination of cis and trans isomer ratios. However, preferably, the CHDM residues have a trans isomer content in the range of about 60 to 100 mol %. A more preferred isomer content is in the range of about 60 to about 80 mol % trans isomer.

The polyesters can be readily prepared by conventional methods well known in the art. For example, melt-phase or a combination of melt-phase and solid-phase polycondensation techniques may be used if desired. The polyesters typically have an inherent viscosity (I.V.) of about 0.4 to 1.2, preferably about 0.6 to 1.1. Films having an I.V. of less than 0.6 may experience a reduction in toughness when the final biaxially stretched film is creased. As used herein, I.V. determinations are made at 25° C. using 0.50 gram of polymer per 100 mL of a solvent composed of 60 weight percent phenol and 40 weight percent tetrachloroethane. The basic method of determining the I.V. of the polyesters herein is set forth in ASTM method D2857-95.

The diacid residues of the polyesters may be derived from the dicarboxylic acid or a derivative of the diacid such as the lower alkyl esters, e.g., dimethyl terepthalate, acid halides, e.g., diacid chlorides, or, in some cases, anhydrides.

The polyester film compositions should contain about 0.5 mol % or more of residues of other dicarboxylic acids or other glycols in order to prevent crystallization of the melt while extruding onto the casting roll. But modifying amounts of such materials should not be more than about 5 mole percent in order to maintain a high melting point in the polymer. Preferably, the polyester film compositions contain from about 0.7 to about 3 mole percent of a modifying dicarboxylic acid or diol residue.

Useful modifying monomers include other dicarboxylic acids containing about 4 to about 14 carbon atoms and other glycols containing about 2 to about 12 carbon atoms. Preferred modifying acids include isophthalic acid, 1,4-cyclohexanedicarboxylic acid, and 2,6-naphhalenedicarboxylic acid. Some preferred modifying glycols include ethylene glycol, 1,3-propanediol, 1,6-hexanediol, neopentyl glycol, and 2,2,4,4-tetramethyl-1,3-cyclobutanediol.

Examples of the catalyst materials that may be used in the synthesis of the polyesters utilized in the present invention include titanium, manganese, zinc, cobalt, antimony, gallium, lithium, calcium, silicon and germanium. Such catalyst systems are described in U.S. Pat. Nos. 3,907,754, 3,962,189, 4,010,145, 4,356,299, 5,017,680, 5,668,243 and 5,681,918, herein incorporated by reference in their entirety. Preferred catalyst metals include titanium and manganese and most preferred is titanium. The amount of catalytic metal used may range from about 5 to 100 ppm, but the use of catalyst concentrations of about 5 to about 35 ppm titanium is preferred in order to provide polyesters having good color, thermal stability and electrical properties. Phosphorus compounds frequently are used in combination with the catalyst metals, and any of the phosphorus compounds normally used in making polyesters may be used. Up to about 100 ppm phosphorus typically may be used.

Although not required, other additives typically present in polyesters may be used if desired so long as they do not hinder the performance of the polyesters used to prepare the film. Such additives may include, but are not limited to, antioxidants, ultraviolet light and heat stabilizers, metal deactivators, colorants, pigments, pinning agents, impact modifiers, nucleating agents, branching agents, flame retardants, and the like.

Branching agents useful in making the polyesters formed within the context of the invention can be ones that provide branching in the acid unit portion of the polyester, or in the glycol unit portion, or it can be a hybrid. Some of these branching agents have already been described herein. However, illustrative of such branching agents are polyfunctional acids, polyfunctional anhydrides, polyfunctional glycols and acid/glycol hybrids. Examples include tri or tetracarboxylic acids and their corresponding anhydrides, such as trimesic acid, pyromellitic acid and lower alkyl esters thereof and the like, and tetrols such as pentaerythritol. Also triols such as trimethylopropane or dihydroxy carboxylic acids and hydroxydicarboxylic acids and derivatives, such as dimethyl hydroxy terephthalate, and the like are useful within the context of this invention. Trimellitic anhydride is a preferred branching agent.

In the first step of the process for preparing the polyester film or sheet material, a melt of the polyester described above is extruded into an essentially amorphous film at any temperature known in the art, e.g., typically at a temperature of about 290 to 325° C. The thickness of the unstretched (or unoriented) film normally is in the range of about 450 to 1800 microns (18-70 mils), more typically about 450 to 1400 microns (18-55 mils).

The initial film extrusion can be performed by any usual method, including but not restricted to extrusion on a single screw extruder or extrusion on a twin screw extruder. The melt emerges from the extruder through a die and is immediately cast upon a rotating drum that cools and solidifies the melt. If the crystallization rate of the polymer is too fast, the melt cannot cool quickly enough on the drum to prevent crystallization. A crystalline film cannot be stretched in the subsequent steps of the film production process without difficulty. Note, however, that it is not a problem if only the edges (about the outer ½ inch) of the film crystallize; these edges can be removed prior to stretching.

Several procedures can be followed to improve the cooling of the melt onto the drum, including internally cooling the drum with high cold water within, pinning the melt quickly to the casting roll either electrostatically (i.e. using pinning wires) or with air knives, or by polishing (passing the melt between two rolls, each of which is cooled). However, even using all of these methods, pure homopolymer PCT will still crystallize when cast at thicknesses greater than 450 microns (18 mils).

It has been surprisingly discovered that small amounts of comonomer can be added to the PCT to prevent this crystallization and to permit casting of film at thicknesses greater than 450 micron. Such cast thicknesses are desirable in order to stretch PCT down to the desired final thicknesses of 70-150 microns.

After casting, the essentially amorphous polyester film can be stretched at ratios from about 2.5×2.5 to 3.5×3.5 (preferably 2.5×2.5 to 3×3) at temperatures between 90° C. and 130° C., and the stretched film can be heat-set at an actual film temperature of from 260° C. to Tm, wherein Tm is the melting point of the polymer as measured by differential scanning calorimetry (DSC), for a time at the actual film temperature of between 1 and 120 seconds, preferably, 1 to 60 seconds, while maintaining the dimensions of the stretched film.

In a preferred embodiment, the film is stretched at a ratio of about 2.5× to 3× in the machine direction (MD) and about 2.5× to 3× in the transverse direction (TD) at temperatures between 90 and 110° C. Stretching at ratios higher than 3× may result in embrittlement of the film. After stretching, the film can be heat-set at actual film temperatures from 260° C. to Tm, wherein Tm is the melting point of the polymer as measured by differential scanning calorimetry (DSC), for a period of time greater than about 5 seconds. Note that depending on the heat source of the oven (e.g., convection, radiation, etc.), there may be an amount of time required to heat the film up to 260° C. This time may be up to 30 seconds. This additional time is not included in the heat-setting time listed herein, which refers only to the time that the sample actually spends at 260° C. to Tm.

The initial film extrusion can be performed immediately prior to stretching (i.e., in-line), or at a separate time. During heat-setting, the stretched film is maintained in the stretched dimensions of the film, by means of a tenter frame or other mechanical device that prevents excessive relaxation of the stretched film during heat-setting. During heat-setting, the film can be stretched or relaxed by up to 10%, i.e., the overall dimension of the film can be increased or decreased by up to 10%.

Any conventional method may be used in stretching or orienting any film of the invention. For example, the extruded polyester film may be stretched by roll stretching, long-gap stretching, tenter stretching, tubular stretching, or combinations thereof. With any of these methods, it is possible to do sequential biaxial stretching, simultaneous biaxial stretching, uniaxial stretching or combinations thereof. Simultaneous biaxial stretching involves stretching the machine and transverse directions of the film at the same time. In a simultaneous biaxial stretch, the stretch ratio does not have to be the same in the transverse direction as it is in the machine direction. Sequential biaxial stretching involves first stretching in the machine direction, for example, in a roll-to-roll stretch, and then subsequently stretching in the transverse direction, for example, using a tenter frame. In a sequential stretching process, the two stretches may be performed one immediately after the other (i.e., in line) or at separate times. The machine direction is defined as the long direction of the film, as it is rolled. The transverse direction is defined as the width of the film, i.e, the direction perpendicular to the machine direction. If a sequential biaxial stretch is performed, the stretch ratio and temperature of the stretch do not have to be the same in the transverse direction as it is in the machine direction.

The stretched or oriented polyester film can be heat-set according to known methods. Heat setting may occur in a continuous process, for example, passing a roll of stretched film continuously through an oven, or as a batch process, for example, wherein films are placed in heat-setting frames and placed individually in a heat-setting oven for a fixed length of time. Heat-setting may be performed immediately after stretching (i.e., in-line), or at separate times. The film may be relaxed or expanded by up to 10% during heat-setting.

The number of stretching and heat-setting steps may be varied. The polyester film may be subjected to a single stretch and single heat-setting pass or treatment, a single stretch and multiple heat-setting passes, multiple stretch and a single heat-setting pass, or multiple stretch and multiple heat-setting passes. If multiple stretch and/or heat-setting passes are performed, it is possible that the stretch and heat-setting passes may alternate in timing, but it is also possible that one heat-setting pass may follow a prior heat-setting pass without an intervening stretch pass. The conditions of each pass do not have to be the same as the previous pass. For example, the polyester film may be heat-set by a two-stage heat-setting process whereby the first heat-setting is performed at any actual film temperature above the stretch temperature. Subsequently, the film is heat-set a second time at actual film temperatures in a range of 260° C. to Tm, wherein Tm is the melting point of the polymer, measured by DSC (differential scanning calorimetry).

In one embodiment, the polyester film of the invention has a final thickness value, i.e., after stretching and heat-setting, of about 70-150 microns (about 3-5 mils).

In another embodiment, the biaxially-oriented polyester film undergoes not more than 3% shrinkage when immersed for 10 seconds in a solder bath preheated to 260° C. As used herein, the word "biaxially-oriented" means that the polyester film has undergone both stretching and heat-setting.

Preferably, the biaxially-oriented polyester film does not blister or wrinkle when immersed for 10 seconds in a solder bath preheated to 260° C. Preferably, the biaxially-oriented polyester film also exhibits improved hydrolytic resistance as compared to a similar film prepared from PET, and improved dielectric constant compared to a film prepared from PET and polyimide.

The polyester films of the invention may be useful for any application involving a film that requires dimensional stability at elevated temperatures, but preferably, at 260° C. or above. Particular end uses include flexible circuit boards, nonconductive layers for films in flexible touch screen displays, liquid crystal displays, electrochromic displays, photovoltaic devices (i.e., solar cells), OLEDs (organic light emitting diodes), micro-fluidic devices (disposable medical test kits), among others.

The novel laminate structures of the invention may utilize any of the films or polyesters provided by the invention, and may comprise, in order, a thermally or UV curable or cured adhesive layer and a biaxially-oriented polyester layer. A copper/polyester laminate is also provided by the invention, which comprises, in order, a copper layer, a thermally or UV curable or cured adhesive layer, and a biaxially-oriented polyester layer. The copper layer contains metallic copper foil typically having a thickness of about 17 to 140 microns, preferably about 30 to 70 microns. The copper foil may be wrought or rolled or electrodeposited copper foil. The thermally curable adhesive layer may be selected from a variety of known adhesive compositions such as acrylic, flame retardant (FR) acrylic, butyral phenolic, acrylic epoxy, polyester, epoxy polyester, modified epoxy and the like. These adhesives typically are cured by application of or exposure to heat to cause the adhesive to be heated to a temperature of about 120 to 180° C. for a period of about 30 minutes to an hour under pressures of about 700 to 3500 kilopascals (100 to 500 pounds per square inch). The thickness of the cured adhesive layer typically is in the range of about 15 to 100 microns.

Processes of preparing thermoplastic articles comprising these laminate structures are also provided by the invention, which comprise applying heat and pressure to the laminate structures. The laminate structures of the invention may be used in any use known in the art or described herein, but are preferably used in flexible electronic circuit boards. The laminates of the invention can be used in a single-layer electronic circuit, a two-layer electronic circuit and/or a multi-layer electronic circuit, for example, as depicted in FIGS. 1-3.

As shown, a thermoplastic article may also be obtained by applying heat and pressure to multiples of laminates as described above or "sandwiches". In the multilaminate embodiments and/or "sandwich" structures, an adhesive layer such as that described above can also be applied between laminates.

Figure 1:
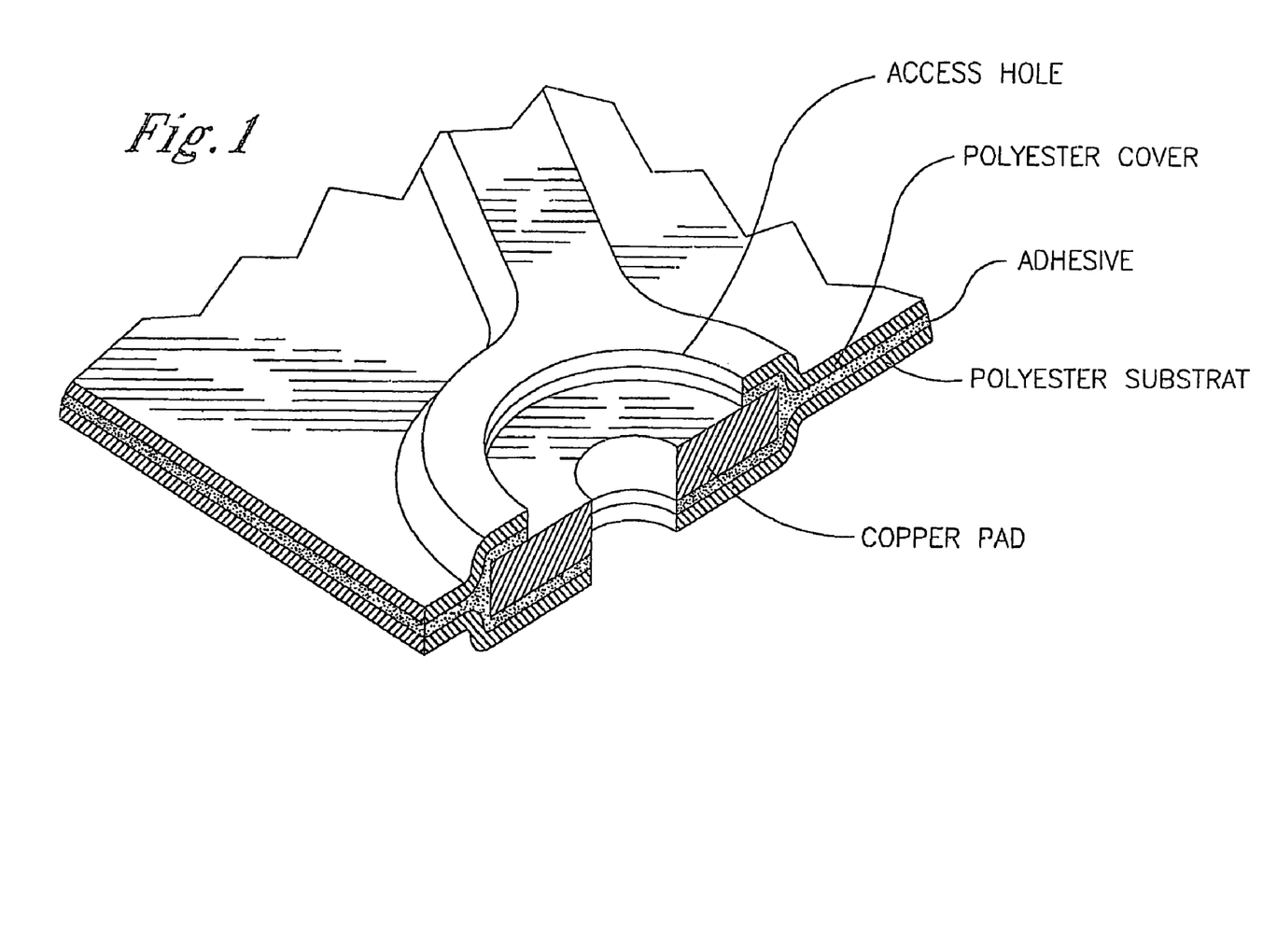
FIG. 1 is a representation of a single layer flexible electronic circuit useful in the invention.
Figure 2:
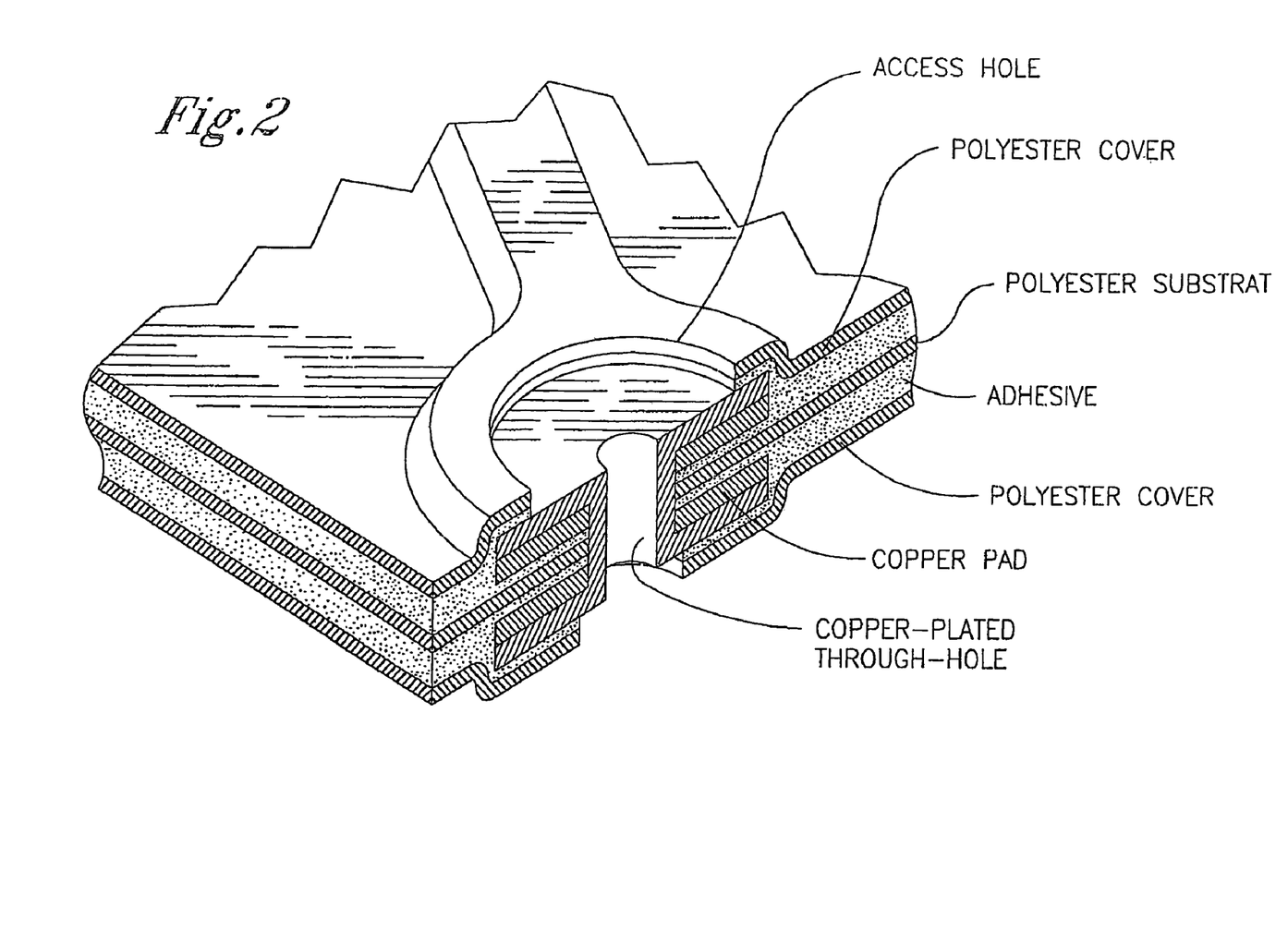
FIG. 2 is a representation of a double layer flexible electronic circuit useful in the invention.
Figure 3:
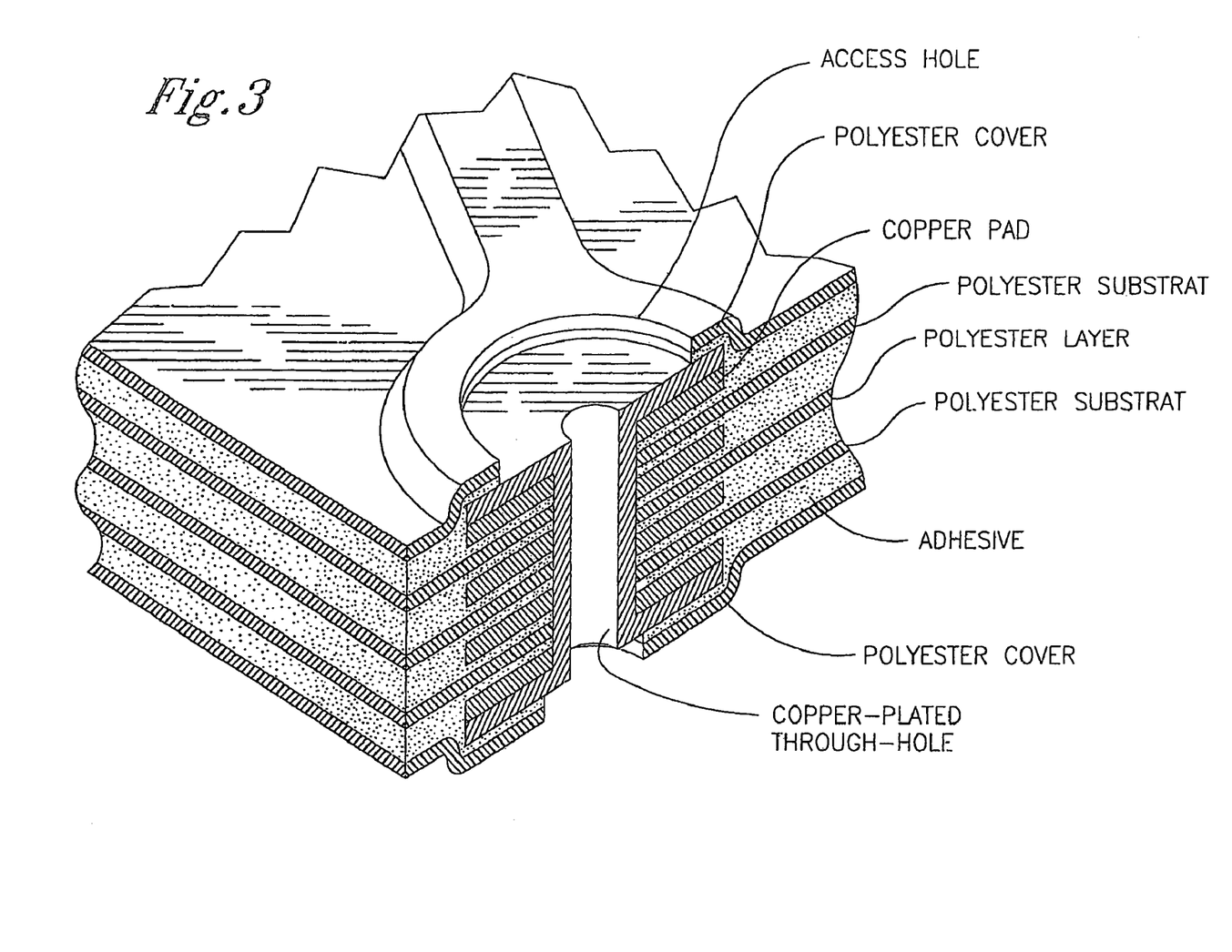
FIG. 3 is a representation of a multi-layer flexible electronic circuit useful in the invention.

In FIGS. 1-3, the polyester films of the invention can be used as the outer layer and/or as an inner layer for a flexible electronic circuit, whether or not it is called a polyester substrate, a polyester cover, or another term. It is not intended that the invention be limited by the terms "substrate" or "cover" as depicted in the drawings.

As used herein, the indefinite article "a" means one or more.

Unless otherwise indicated, all numbers expressing quantities of ingredients, properties such as molecular weight, reaction conditions, and so forth used in the description and claims are to be understood as being modified in all instances by the term "about." Accordingly, unless indicated to the contrary, the numerical parameters set forth in the following description and attached claims are approximations that may vary depending upon the desired properties sought to be obtained by the present invention. At the very least, each numerical parameter should at least be construed in light of the number of reported significant digits and by applying ordinary rounding techniques. Further, the ranges stated in this disclosure and the claims are intended to include the entire range specifically and not just the endpoint(s). For example, a range stated to be 0 to 10 is intended to disclose all whole numbers between 0 and 10 such as, for example 1, 2, 3, 4, etc., all fractional numbers between 0 and 10, for example 1.5, 2.3, 4.57, 6.1113, etc., and the endpoints 0 and 10.

Notwithstanding that the numerical ranges and parameters describing the invention are approximations, the numerical values set forth in the specific examples are reported as precisely as possible. Any numerical value, however, inherently contains certain errors necessarily resulting from the standard deviation found in their respective testing measurements.

The polyester films and the preparation thereof according to the present invention are further illustrated by the following examples.

EXAMPLES

Solder resistance was measured according to IPC-TM-650 2.4.13.1 with the solder bath temperature set at 260° C.

The specimens tested in the following examples were not made into laminates, were not etched, and were unclad, i.e., neither coated nor laminated.

Film shrinkage was determined by measuring the dimensions of a 5.1 cm×5.1 cm (2×2 inch) film sample at two locations in the MD (machine direction) and two locations in the TD (transverse direction). The film sample then was immersed in a solder bath preheated to 260° C. for 10 seconds as described herein. The film was observed for blisters and wrinkles. The dimensions were then measured again. Each dimension after immersion was subtracted from the original dimension and then divided by the original dimension to obtain percent shrinkage. The four percent shrinkage values (2 for MD and 2 for TD) were averaged together to obtain the overall percent shrinkage.

Haze was measured according to ASTM D1003.

Example Set 1

Comparative Examples C-1 and C-2, and Example 1 demonstrate the effect of composition on the ability to extrude and cast amorphous films from PCT and from PCT pellet-blended with various amounts of a copolyester comprising 95 mol % terephthalic acid and 5 mol % isophthalic acid as the acid component, and 100 mol % 1,4-cyclohexanedimethanol (CHDM) as the glycol component (hereafter referred to as PCTI).

Pellets of each were prepared in a melt-phase polycondensation process using 100 ppm Ti catalyst (as titanium isobutoxide). The pellets were dried at 150° C. for 4 hours and subsequently extruded into sheeting of 430, 550, and 750 microns thick on a 64-mm (2.5 inch) barrel diameter, 24:1 L/D extruder. The melt temperature and die temperature were maintained at 315° C. The sheets were cast through a 21-inch wide die onto a casting drum with roll temperatures set at 15° C. (60° F.). A pinning wire was used to facilitate intimate contact of the melt with the casting drum so as to hasten cooling.

Table 1 below shows the amount of PCTI in each example of this set, the film acid composition, and the clarity, by visual inspection, of each film produced.

TABLE 1

| | | Film acid composition | | Film thickness (microns) | | |
|---|---|---|---|---|---|---|
| Example | PCTI (wt %) | Terephthalic Acid (mol %) | Isophthalic Acid (mol %) | 430 | 550 | 750 |
| C-1 | 0 | 100 | 0 | clear | hazy | White |
| C-2 | 5 | 99.75 | 0.25 | clear | hazy | White |
| 1 | 15 | 99.25 | 0.75 | clear | clear | Clear |

As seen from Table 1, Comparative Examples C-1 and C-2 did not produce clear, amorphous films at cast film thicknesses of 550 and 750 microns. Additionally, these films broke when an attempt was made to pass them through the roll-to-roll stretching unit of a commercial sequential stretching apparatus, even though the edge beads were trimmed off.

Example 1 is an example of films according to the present invention. The films in Example 1 were clear in the center, although the outer quarter inch was crystalline, at all three thicknesses. The edge crystallinity was not a problem as it was easily trimmed off.

The 430, 550, and 750 micron thick cast films of Example 1 were then stretched and tentered into 65, 80, and 110 micron thick films, respectively, by first stretching on a roll stack in the machine direction at a 2.6× stretch ratio and 95° C. temperature, and subsequently stretching between clips in a tenter frame in the transverse direction at a 2.6× stretch ratio and 95° C. temperature. The films were immediately passed into an annealing zone set at 270° C., which provided the heat-setting treatment. The films were then immersed for 10 seconds in a solder bath preheated to 260° C. and the resulting % shrinkage was measured to be less than 3%, with no visible blisters observed.

Example Set 2

Comparative Example C-3 and Examples 2 through 8 further demonstrate the effect of composition on the ability to extrude and cast amorphous films from PCT and from PCT pellet-blended with various amounts of a copolyester comprising 95 mol % terephthalic acid and 5 mol % isophthalic acid as the acid component, and 100 mol % 1,4-cyclohexanedimethanol (CHDM) as the glycol component (hereafter referred to as PCTI).

Pellets of each were prepared in a melt-phase polycondensation process using 100 ppm Ti catalyst (as titanium isobutoxide). The pellets were dried at 150° C. for 4 hours and subsequently extruded into a 900-micron thick sheeting on a 52-mm (2.0 inch) barrel diameter, 30:1 L/D extruder. The melt temperature and die temperature were maintained at 310° C. Each sheet was cast through a 21-inch wide die onto a casting drum with roll temperatures set at 55° C. (130° F.). An air knife was used to facilitate intimate contact of the melt with the casting drum so as to hasten cooling. The haze of each sheet was measured and is shown in Table 2.

TABLE 2

| Example | PCTI (wt %) | Terephthalic Acid (mol %) | Isophthalic Acid (mol %) | Haze (%) |
|---|---|---|---|---|
| C-3 | 0 | 100 | 0 | 41.2 |
| 2 | 10 | 99.50 | 0.50 | 13.0 |
| 3 | 13 | 99.35 | 0.65 | 11.1 |
| 4 | 15 | 99.25 | 0.75 | 9.5 |
| 5 | 15 | 99.25 | 0.75 | 7.1 |
| 6 | 20 | 99.00 | 1.00 | 4.2 |
| 7 | 25 | 98.75 | 1.25 | 4.7 |
| 8 | 30 | 98.50 | 1.50 | 4.3 |

The film of Comparative Example C-3 (neat PCT) was observed to be white.

The results of Examples 2-8 demonstrate that increasing the amount of PCTI decreases the amount of haze in the film. Typically, an acceptable range of haze is 15% or less.

Example Set 3

Examples 9-14 further demonstrate the effect of composition on the ability to extrude and cast amorphous films from PCT pellet-blended with 30 weight percent of a copolyester comprising 95 mol % terephthalic acid and 5% isophthalic acid as the acid component, and 100 mol % 1,4-cyclohexanedimethanol (CHDM) as the glycol component (hereafter referred to as PCTI).

Pellets of each were prepared in a melt-phase polycondensation process using 100 ppm Ti catalyst (as titanium isobutoxide). The pellets were dried at 150° C. for 4 hours and subsequently extruded into sheeting of various thicknesses on a 40-mm (1.5 inch) barrel diameter, 30:1 L/D extruder. The melt temperature and die temperature were maintained at 315° C. Each sheet was cast through a 12-inch wide die onto a casting drum with roll temperatures set at 60° C. (140° F.). The haze of each sheet was measured and is shown in Table 3.

TABLE 3

| Example | PCTI (wt %) | Terephthalic Acid (mol %) | Isophthalic Acid (mol %) | Film Thickness (mils) | Film Thickness (microns) | Haze (%) |
|---|---|---|---|---|---|---|
| 9 | 30 | 98.5 | 1.5 | 30 | 760 | 1.28 |
| 10 | 30 | 98.5 | 1.5 | 35 | 890 | 1.07 |
| 11 | 30 | 98.5 | 1.5 | 40 | 1020 | 1.00 |
| 12 | 30 | 98.5 | 1.5 | 45 | 1140 | 3.92 |
| 13 | 30 | 98.5 | 1.5 | 50 | 1270 | 6.16 |
| 14 | 30 | 98.5 | 1.5 | 55 | 1400 | 13.00 |

Example Set 4

Examples 15-44 and Comparative Examples C-4-C-29 demonstrate the effect of heat-set temperature on shrinkage of films made from either a copolyester comprising 95 mol % terephthalic acid and 5 mol % isophthalic acid as the acid component, and 100 mol % 1,4-cyclohexanedimethanol (CHDM) as the glycol component (hereafter referred to as PCTI), or a blend of 85 wt % PCT and 15 wt % PCTI (hereafter referred to as blend).

Pellets of each were prepared in a melt-phase polycondensation process using 100 ppm Ti catalyst (as titanium isobutoxide). The pellets were dried at 120° C. for 16 hours and subsequently extruded into a 450 micron (18 mil) thick sheeting on a Davis Standard 64-mm (2.5 inch) barrel diameter extruder equipped with a polyester barrier type screw. The melt temperature and die temperature were maintained at 300° C. Each sheet was cast onto a 3-roll down-stack with roll temperatures set at 49° C./57° C./66° C. (120° F./135° F./150° F.) from top to bottom, respectively.

The sheets were then stretched and tentered on a commercial sequential stretch and tenter apparatus, with the machine direction (MD) stretched on a roll stack at the ratio and temperature shown in Table 4 and the transverse direction (TD) subsequently stretched between clips in a tenter frame at the conditions shown in Table 4. The stretched films were immediately passed into an annealing zone, which provided the first heat-set (HS) treatment or pass. This annealing zone was set at the heat-set zone set temperature and time indicated in Table 4.

Actual film temperatures in the annealing zone were obtained by placing a temperature indicating tape onto each film. This tape changes color at a series of known temperatures to indicate the maximum temperature the film experienced.

In Examples 15 through 30 and 40, and Comparative Examples C-4 through C-11 and C-14 through C-21, a second heat-set treatment was performed by clamping the films into an aluminum frame, which was then inserted into a box-oven at the heat-set zone set temperature and time indicated in Table 4. For these examples, two films were placed in the frame, and a thermocouple was sandwiched between the two films to measure the actual film temperature.

In Examples 31 through 39 and 41 through 44, and Comparative Examples C-12, C-13, and C-22 through C-29, a second heat-set treatment was performed by passing the films through the annealing zone of the tenter frame a second time at the heat-set zone set temperature and time indicated in Table 4. The actual film temperature listed was the highest temperature attained during the combination of first and second heat-sets. Note that the set temperature is higher than the actual film temperature, and that the heat-set time listed includes the time required to heat the sample to the actual film temperature. Because of the time required for the film to heat up, the actual film temperature shown is a function of both set temperature and time. The heat-set film was then immersed for 10 seconds in a solder bath preheated to 260° C., and the resulting % shrinkage is shown in Table 4.

In Table 4, "MD ratio" refers to stretching in the machine direction. "TD ratio" refers to stretching in the transverse direction. Temperatures are given in ° C. Time is given in seconds. "n/a" means that a second heat-set treatment was not performed. % shrinkage refers to the percentage that the samples of film shrank after being immersed for 10 seconds in a solder bath preheated to 260° C. solder bath for 10 seconds.

TABLE 4

| Ex. No. | Film Comp. | MD ratio | MD Temp (° C.) | TD ratio | TD Temp (° C.) | 1st HS Temp (° C.) | 1st HS Time (sec) | 2nd HS Temp (° C.) | 2nd HS Time (sec) | Total Time (sec) | Actual Film Temp (° C.) | Solder Bath Shrink (%) |
|---|---|---|---|---|---|---|---|---|---|---|---|---|
| C-4 | Blend | 2.5 | 91 | 2.5 | 99 | 288 | 9 | n/a | 0 | 9 | 220 | 9.9% |
| C-5 | Blend | 2.5 | 91 | 2.5 | 99 | 288 | 9 | 270 | 60 | 69 | 248 | 5.3% |
| 15 | Blend | 2.5 | 91 | 2.5 | 99 | 288 | 9 | 280 | 120 | 129 | 264 | 1.0% |
| C-6 | Blend | 2.5 | 91 | 2.5 | 99 | 288 | 9 | 280 | 60 | 69 | 254 | 5.3% |
| 16 | Blend | 2.5 | 91 | 2.5 | 99 | 288 | 9 | 280 | 60 | 69 | 263 | 1.5% |
| C-7 | Blend | 2.5 | 91 | 2.5 | 99 | 288 | 9 | 290 | 9 | 18 | 220 | 12.6% |
| 17 | Blend | 2.5 | 91 | 2.5 | 99 | 288 | 9 | 290 | 60 | 69 | 275 | 0.9% |
| 18 | Blend | 2.5 | 91 | 2.5 | 99 | 288 | 9 | 290 | 120 | 129 | 277 | 1.0% |
| 19 | Blend | 2.5 | 91 | 2.5 | 99 | 288 | 9 | 290 | 240 | 249 | 277 | 0.7% |
| C-8 | Blend | 2.5 | 91 | 2.5 | 99 | 288 | 9 | 288 | 20 | 29 | 252 | 4.1% |
| 20 | Blend | 2.5 | 91 | 2.5 | 99 | 288 | 9 | 288 | 30 | 39 | 260 | 2.6% |
| 21 | Blend | 2.5 | 91 | 2.5 | 99 | 288 | 9 | 288 | 60 | 69 | 262 | 2.2% |
| 22 | Blend | 2.5 | 91 | 2.5 | 99 | 288 | 9 | 296 | 20 | 29 | 260 | 2.3% |
| 23 | Blend | 2.5 | 91 | 2.5 | 99 | 288 | 9 | 296 | 30 | 39 | 267 | 1.4% |
| 24 | Blend | 2.5 | 91 | 2.5 | 99 | 288 | 9 | 296 | 60 | 69 | 267 | 1.3% |
| 25 | Blend | 2.5 | 91 | 2.5 | 99 | 288 | 9 | 302 | 20 | 29 | 268 | 2.0% |
| 26 | Blend | 2.5 | 91 | 2.5 | 99 | 288 | 9 | 302 | 30 | 39 | 272 | 1.3% |
| 27 | Blend | 2.5 | 91 | 2.5 | 99 | 288 | 9 | 302 | 60 | 69 | 271 | 1.1% |
| 28 | Blend | 2.5 | 91 | 2.5 | 99 | 288 | 9 | 307 | 20 | 29 | 271 | 0.7% |
| 29 | Blend | 2.5 | 91 | 2.5 | 99 | 288 | 9 | 307 | 30 | 39 | 273 | 1.0% |
| 30 | Blend | 2.5 | 91 | 2.5 | 99 | 288 | 9 | 307 | 60 | 69 | 278 | 1.1% |
| C-9 | Blend | 2.5 | 91 | 2.5 | 99 | 288 | 9 | 313 | 20 | 29 | 281 | melted |
| C-10 | Blend | 2.5 | 91 | 2.5 | 99 | 288 | 9 | 313 | 30 | 39 | 284 | melted |
| C-11 | Blend | 2.5 | 91 | 2.5 | 99 | 288 | 9 | 313 | 60 | 69 | 286 | melted |
| C-12 | Blend | 2.5 | 91 | 2.5 | 99 | 288 | 9 | 288 | 17 | 26 | 252 | 3.3% |
| 31 | Blend | 2.5 | 91 | 2.5 | 99 | 288 | 9 | 288 | 33 | 42 | 260 | 2.6% |
| 32 | Blend | 2.5 | 91 | 2.5 | 99 | 288 | 9 | 288 | 33 | 42 | 260 | 2.3% |
| 33 | Blend | 2.5 | 91 | 2.5 | 99 | 288 | 9 | 293 | 33 | 42 | 266 | 1.8% |
| 34 | Blend | 2.5 | 91 | 2.5 | 99 | 288 | 9 | 299 | 17 | 26 | 263 | 1.8% |
| 35 | Blend | 2.5 | 91 | 2.5 | 99 | 288 | 9 | 299 | 33 | 42 | 271 | 1.2% |
| 36 | Blend | 2.5 | 91 | 2.5 | 99 | 288 | 9 | 304 | 33 | 42 | 277 | 0.8% |
| C-13 | Blend | 2.5 | 91 | 2.5 | 99 | 288 | 9 | 310 | 33 | 42 | 282 | melted |
| 37 | Blend | 2.5 | 91 | 2.5 | 99 | 288 | 9 | 288 | 33 | 42 | 260 | 2.9% |
| 39 | Blend | 2.5 | 91 | 2.5 | 99 | 288 | 9 | 299 | 33 | 42 | 263 | 1.4% |
| C-14 | PCTI | 2.5 | 91 | 2.5 | 102 | 288 | 33 | n/a | 0 | 33 | 250 | 10.7% |
| C-15 | PCTI | 2.5 | 91 | 2.5 | 102 | 288 | 33 | 288 | 20 | 53 | 256 | 7.6% |
| C-16 | PCTI | 2.5 | 91 | 2.5 | 102 | 288 | 33 | 288 | 30 | 63 | 260 | 7.5% |
| C-17 | PCTI | 2.5 | 91 | 2.5 | 102 | 288 | 33 | 288 | 60 | 93 | 263 | 5.8% |
| C-18 | PCTI | 2.5 | 91 | 2.5 | 102 | 288 | 33 | 296 | 30 | 63 | 264 | 4.6% |
| C-19 | PCTI | 2.5 | 91 | 2.5 | 102 | 288 | 33 | 296 | 60 | 93 | 265 | 4.6% |
| C-20 | PCTI | 2.5 | 91 | 2.5 | 102 | 288 | 33 | 302 | 20 | 53 | 269 | 3.1% |
| 40 | PCTI | 2.5 | 91 | 2.5 | 102 | 288 | 33 | 302 | 30 | 63 | 273 | 2.9% |
| C-21 | PCTI | 2.5 | 91 | 2.5 | 102 | 288 | 33 | 307 | 50 | 66 | 278 | melted |
| C-22 | PCTI | 2.5 | 91 | 2.5 | 99 | 288 | 9 | n/a | 0 | 9 | 220 | 28.1% |
| C-23 | PCTI | 2.5 | 91 | 2.5 | 99 | 288 | 9 | 288 | 33 | 42 | 260 | 5.6% |
| C-24 | PCTI | 2.5 | 91 | 2.5 | 99 | 288 | 9 | 293 | 33 | 42 | 266 | 4.9% |
| 41 | PCTI | 2.5 | 91 | 2.5 | 99 | 288 | 9 | 299 | 33 | 42 | 271 | 2.5% |
| C-25 | PCTI | 2.5 | 91 | 2.5 | 99 | 288 | 9 | 304 | 33 | 42 | 277 | melted |
| 42 | PCTI | 2.5 | 91 | 2.5 | 99 | 288 | 9 | 299 | 33 | 42 | 271 | 2.7% |
| C-26 | PCTI | 2.75 | 91 | 2.75 | 99 | 288 | 9 | n/a | 0 | 9 | 220 | 32.0% |
| C-27 | PCTI | 2.75 | 91 | 2.75 | 99 | 288 | 9 | 288 | 33 | 42 | 260 | 9.5% |
| C-28 | PCTI | 2.75 | 91 | 2.75 | 99 | 288 | 9 | 293 | 33 | 42 | 266 | 5.8% |
| 43 | PCTI | 2.75 | 91 | 2.75 | 99 | 288 | 9 | 299 | 33 | 42 | 271 | 2.9% |
| C-29 | PCTI | 2.75 | 91 | 2.75 | 99 | 288 | 9 | 304 | 33 | 42 | 277 | melted |
| 44 | PCTI | 2.75 | 91 | 2.75 | 99 | 288 | 9 | 299 | 33 | 42 | 271 | 2.9% |

As seen from Table 4, Comparative Examples C-4 through C-8 and C-12 show that actual film temperatures below 260° C. resulted in too much shrinkage at 260° C. for the films of PCT containing 15 wt % PCTI (Blend).

Comparative Examples C-9 through C-11 and C-13 show that actual film temperatures above 280° C. melted the films of PCT containing 15 wt % PCTI (Blend).

The films of PCT containing 15 wt % PCTI (Blend) heat-set at the conditions shown in Examples 15 through 39 have acceptable shrinkage.

Comparative Examples C-14 through C-20, C-22 though C-24, and C-26 through C-28 show that actual film temperatures below 270° C. resulted in too much shrinkage at 260° C. for the films of pure PCTI.

Comparative Examples C-21, C-25, and C-29 show that actual film temperatures above 275° C. melted the films of pure PCT.

The films of pure PCTI heat-set at the conditions shown in Examples 40 through 44 have acceptable shrinkage.

The examples of Set 4 show that increasing the amount of comonomer, in this case from 0.75 to 5 mol % of isophthalic acid, in the film composition reduces the acceptable temperature process window for the films. The blend of PCT with 15 wt % PCTI can be heat-set between 260° C. and 280° C. without either having excessive shrinkage below 260° C. or melting above 280° C. In contrast, pure PCTI (5 mol % isophthalic acid) can only be processed between 270° C. and 275° C. Any increase in comonomer content above 5 mol % would effectively close the heat-set process window.

The invention has been described in detail with particular reference to illustrative and preferred embodiments. But it will be understood that variations and modifications can be effected within the spirit and scope of the invention.

We claim:

1. A biaxially-oriented polyester film produced from a polyester comprising:
   (a) diacid residues comprising between about 95 and about 100 mole percent of terephthalic acid residues;
   (b) diol residues comprising between about 95 and about 100 mole percent of 1,4-cyclohexanedimethanol residues; and
   (c) about 0.5 to about 5 mole percent of another dicarboxylic acid or diol residue,
   wherein the polyester comprises a total of 100 mole percent diacid residues and a total of 100 mole percent diol residues, and
   wherein the polyester film has been heat set at an actual film temperature of from 260° C. to Tm, where Tm is the melting point of the polyester as measured by differential scanning calorimetry (DSC), and has a thickness of 70 to 150 microns.

2. The biaxially-oriented polyester film of claim 1, which is produced by stretching an essentially amorphous cast film of thickness between about 450 and 1800 microns at a ratio from about 2.5×2.5 to 3.5×3.5 while being held at a temperature between 90° C. and 130° C., and heat-setting the stretched film at an actual film temperature of from 260° C. to Tm, where Tm is the melting point of the polyester as measured by differential scanning calorimetry (DSC), while maintaining the dimensions of the stretched film.

3. The biaxially-oriented polyester film of claim 2, wherein the cast film has a thickness between 450 and 1400 microns.

4. The biaxially-oriented polyester film of claim 3, wherein the cast film is stretched at a ratio of 2.5×2.5 to 3×3.

5. The biaxially-oriented polyester film of claim 1, which undergoes not more than 3% shrinkage when immersed for 10 seconds in a solder bath preheated to 260° C.

6. The biaxially-oriented polyester film of claim 1, wherein the 1,4-cyclohexanedimethanol residues have a trans isomer content in the range of about 60 to about 100 mol%.

7. The biaxially-oriented polyester film of claim 6, wherein the 1,4-cyclohexanedimethanol residues have a trans isomer content in the range of about 60 to about 80 mol%.

8. The biaxially-oriented polyester film of claim 1, wherein the diacid residues comprise between about 99.5 and about 95 mole percent of terephthalic acid residues and between about 0.5 and about 5 mole percent of isophthalic acid residues.

9. A biaxially-oriented polyester film produced from a polyester comprising:
   (a) diacid residues comprising between about 95 and about 100 mole percent of terephthalic acid residues;
   (b) diol residues comprising between about 95 and about 100 mole percent of 1,4-cyclohexanedimethanol residues; and
   (c) about 0.5 to about 5 mole percent of another dicarboxylic acid or diol residue,
   wherein the polyester comprises a total of 100 mole percent diacid residues and a total of 100 mole percent diol residues,
   wherein the polyester film has a thickness of 70 to 150 microns,
   wherein the polyester film is produced by stretching an essentially amorphous cast film of thickness between about 450 and 1800 microns at a ratio from about 2.5× 2.5 to 3.5×3.5 while being held at a temperature between 90° C. and 130° C., and heat-setting the stretched film at an actual film temperature of from 260° C. to Tm, where Tm is the melting point of the polyester as measured by differential scanning calorimetry (DSC), while maintaining the dimensions of the stretched film, and
   wherein the polyester film undergoes not more than 3% shrinkage when immersed for 10 seconds in a solder bath preheated to 260° C.

10. The biaxially-oriented polyester film of claim 9, wherein the cast film has a thickness between 450 and 1400 microns.

11. The biaxially-oriented polyester film of claim 10, wherein the cast film is stretched at a ratio of 2.5×2.5 to 3×3.

12. The biaxially-oriented polyester film of claim 9, wherein the stretched film is heat-set for a period of time of 1 to 120 seconds while maintaining the dimensions of the stretched film.

13. The biaxially-oriented polyester film of claim 12, which is produced by sequentially stretching the cast film in the machine and the transverse directions.

14. The biaxially-oriented polyester film of claim 12, which is produced by simultaneously stretching the cast film in the machine and the transverse directions.

15. A thermoplastic article comprising one or more laminates, wherein at least one of said laminates comprises in order:
   I. a thermally curable adhesive; and
   II. a biaxially-oriented polyester film produced from a polyester comprising:
      (a) diacid residues comprising between about 95 and about 100 mole percent of terephthalic acid residues;
      (b) diol residues comprising between about 95 and about 100 mole percent of 1,4-cyclohexanedimethanol residues; and
      (c) about 0.5 to about 5 mole percent of another dicarboxylic acid or diol residue,
      wherein the polyester comprises a total of 100 mole percent diacid residues and a total of 100 mole percent diol residues, and wherein the polyester film has been heat set at an actual film temperature of from 260° C. to Tm, where Tm is the melting point of the polyester as measured by differential scanning calorimetry (DSC), and has a thickness of 70 to 150 microns.

16. The thermoplastic article of claim 15, wherein the polyester film is produced by stretching an essentially amorphous cast film of thickness between about 450 and 1800 microns at a ratio from about 2.5×2.5 to 3.5×3.5 while being held at a temperature between 90° C. and 130° C., and heat-setting the stretched film at an actual film temperature of from 260° C. to Tm, where Tm is the melting point of the polyester as measured by differential scanning calorimetry (DSC), while maintaining the dimensions of the stretched film.

17. The thermoplastic article of claim 16, wherein the cast film has a thickness between 450 and 1400 microns.

18. The thermoplastic article of claim 17, wherein the cast film is stretched at a ratio of 2.5×2.5 to 3×3.

19. The thermoplastic article of claim 15, wherein said at least one laminate comprises in order:
 I. a copper layer;
 II. said thermally curable adhesive; and
 III. said biaxially-oriented polyester film.

20. The thermoplastic article of claim 19, wherein the copper layer has a thickness of 17 to 140 microns, and wherein the polyester has a melting point of at least 270° C. as measured by differential scanning calorimetry (DSC), and an inherent viscosity of 0.4 to 1.2 as measured at 25° C. using 0.50 gram of polymer per 100 mL of a solvent composed of 60 weight percent phenol and 40 weight percent tetrachloroethane according to ASTM method D2857-95.

21. A process for the preparation of a thermoplastic article comprising one or more laminates, wherein at least one of said laminates comprises in order:
 I. a copper layer;
 II. a thermally curable adhesive; and
 III. a biaxially-oriented polyester film produced from a polyester comprising:
  (a) diacid residues comprising between about 95 and about 100 mole percent of terephthalic acid residues;
  (b) diol residues comprising between about 95 and about 100 mole percent of 1,4-cyclohexanedimethanol residues; and
  (c) about 0.5 to about 5 mole percent of another dicarboxylic acid or diol residue,
 wherein the polyester comprises a total of 100 mole percent diacid residues and a total of 100 mole percent diol residues, and
 wherein the polyester film has been heat set at an actual film temperature of from 260° C. to Tm, where Tm is the melting point of the polyester as measured by differential scanning calorimetry (DSC), and has a thickness of 70 to 150 microns,
 said process comprising heating said laminate at a temperature of about 120 to 180° C. under pressure for a period of time sufficient to cure the thermally curable adhesive.

22. The process of claim 21, wherein the polyester film is produced by stretching an essentially amorphous cast film of thickness between about 450 and 1800 microns at a ratio from about 2.5×2.5 to 3.5×3.5 while being held at a temperature between 90° C. and 130° C., and heat-setting the stretched film at an actual film temperature of from 260° C. to Tm, where Tm is the melting point of the polyester as measured by differential scanning calorimetry (DSC), while maintaining the dimensions of the stretched film.

23. The process of claim 22, wherein the cast film has a thickness between 450 and 1400 microns.

24. The process of claim 23, wherein the cast film is stretched at a ratio of 2.5×2.5 to 3×3.

25. A flexible electronic circuit board comprising at least one biaxially-oriented polyester film produced from a polyester comprising:
 (a) diacid residues comprising between about 95 and about 100 mole percent of terephthalic acid residues;
 (b) diol residues comprising between about 95 and about 100 mole percent of 1,4-cyclohexanedimethanol residues; and
 (c) about 0.5 to about 5 mole percent of another dicarboxylic acid or diol residue,
 wherein the polyester comprises a total of 100 mole percent diacid residues and a total of 100 mole percent diol residues, and
 wherein the polyester film has been heat set at an actual film temperature of from 260° C. to Tm, where Tm is the melting point of the polyester as measured by differential scanning calorimetry (DSC), and has a thickness of 70 to 150 microns.

26. The flexible electronic circuit board of claim 25, wherein the polyester film is produced by stretching an essentially amorphous cast film of thickness between about 450 and 1800 microns at a ratio from about 2.5×2.5 to 3.5×3.5 while being held at a temperature between 90° C. and 130° C., and heat-setting the stretched film at an actual film temperature of from 260° C. to Tm, where Tm is the melting point of the polyester as measured by differential scanning calorimetry (DSC), while maintaining the dimensions of the stretched film.

27. The flexible electronic circuit board of claim 26, wherein the cast film has a thickness between 450 and 1400 microns.

28. The flexible electronic circuit board of claim 27, wherein the cast film is stretched at a ratio of 2.5×2.5 to 3×3.

29. The flexible electronic circuit board of claim 25, wherein the biaxially-oriented polyester film undergoes not more than 3% shrinkage when immersed for 10 seconds in a solder bath preheated to 260° C.

30. The flexible electronic circuit board of claim 25, which comprises one or more laminates, wherein at least one of said laminates comprises in order:
 I. a copper layer;
 II. a thermally curable adhesive; and
 III. said biaxially-oriented polyester film.

31. A biaxially-oriented polyester film produced from a polyester comprising:
 (a) diacid residues comprising between about 95 and about 100 mole percent of terephthalic acid residues;
 (b) diol residues comprising between about 95 and about 100 mole percent of 1,4-cyclohexanedimethanol residues; and
 (c) about 0.5 to about 5 mole percent of another dicarboxylic acid or diol residue,
 wherein the polyester comprises a total of 100 mole percent diacid residues and a total of 100 mole percent diol residues, and
 wherein said polyester film undergoes not more than 3% shrinkage when immersed for 10 seconds in a solder bath preheated to 260° C.

32. The biaxially-oriented polyester film of claim 31, wherein the polyester has an inherent viscosity of 0.5 to 1.1 as measured at 25° C. using 0.50 gram of polymer per 100 mL of a solvent composed of 60 weight percent phenol and 40 weight percent tetrachloroethane according to ASTM method D2857-95.

33. A biaxially-oriented polyester film produced from a polyester comprising:
(a) diacid residues comprising between about 95 and about 100 mole percent of terephthalic acid residues;
(b) diol residues comprising between about 95 and about 100 mole percent of 1,4-cyclohexanedimethanol residues; and
(c) about 0.5 to about 5 mole percent of another dicarboxylic acid or diol residue,
wherein the polyester comprises a total of 100 mole percent diacid residues and a total of 100 mole percent diol residues,
wherein the polyester film is produced by stretching an essentially amorphous cast film of thickness between about 450 and 1800 microns at a ratio from about 2.5× 2.5 to 3.5×3.5 while being held at a temperature between 90° C. and 130° C., and heat-setting the stretched film at an actual film temperature of from 260° C. to Tm, where Tm is the melting point of the polyester as measured by differential scanning calorimetry (DSC), while maintaining the dimensions of the stretched film, and
wherein the polyester film undergoes not more than 3% shrinkage when immersed for 10 seconds in a solder bath preheated to 260° C.

34. The biaxially-oriented polyester film of claim 33, wherein the cast film has a thickness between 450 and 1400 microns.

35. The biaxially-oriented polyester film of claim 34, wherein the cast film is stretched at a ratio of 2.5×2.5 to 3×3.

36. The biaxially-oriented polyester film of claim 33, wherein the stretched film is heat-set for a period of time of 1 to 120 seconds while maintaining the dimensions of the stretched film.

37. The biaxially-oriented polyester film of claim 36, which is produced by sequentially stretching the cast film in the machine and the transverse directions.

38. The biaxially-oriented polyester film of claim 36, which is produced by simultaneously stretching the cast film in the machine and the transverse directions.

39. A thermoplastic article comprising one or more laminates, wherein at least one of said laminates comprises in order:
I. a thermally curable adhesive; and
II. a biaxially-oriented polyester film produced from a polyester comprising:
(a) diacid residues comprising between about 95 and about 100 mole percent of terephthalic acid residues;
(b) diol residues comprising between about 95 and about 100 mole percent of 1,4-cyclohexanedimethanol residues; and
(c) about 0.5 to about 5 mole percent of another dicarboxylic acid or diol residue,
wherein the polyester comprises a total of 100 mole percent diacid residues and a total of 100 mole percent diol residues, and
wherein said polyester film undergoes not more than 3% shrinkage when immersed for 10 seconds in a solder bath preheated to 260° C.

40. The thermoplastic article of claim 39, wherein said at least one laminate comprises in order:
I. a copper layer;
II. said thermally curable adhesive; and
III. said biaxially-oriented polyester film.

41. A flexible electronic circuit board comprising the thermoplastic article of claim 39.

42. The biaxially-oriented polyester film of claim 1, wherein the polyester is a blend of pellets of two or more polyester compositions.

43. The biaxially-oriented polyester film of claim 9, wherein the polyester is a blend of pellets of two or more polyester compositions.

44. The thermoplastic article of claim 15, wherein the polyester is a blend of pellets of two or more polyester compositions.

45. The process of claim 21, wherein the polyester is a blend of pellets of two or more polyester compositions.

46. The flexible electronic circuit board of claim 25, wherein the polyester is a blend of pellets of two or more polyester compositions.

47. The biaxially-oriented polyester film of claim 31, wherein the polyester is a blend of pellets of two or more polyester compositions.

48. The biaxially-oriented polyester film of claim 33, wherein the polyester is a blend of pellets of two or more polyester compositions.

49. The thermoplastic article of claim 39, wherein the polyester is a blend of pellets of two or more polyester compositions.

* * * * *